United States Patent [19]

Ikeda

[11] Patent Number: 4,973,979
[45] Date of Patent: Nov. 27, 1990

[54] CIRCUIT AND METHOD FOR CONVERTING DIGITAL SIGNAL INTO CORRESPONDING ANALOG SIGNAL

[75] Inventor: Hiroshi Ikeda, Kanagawa, Japan

[73] Assignee: Nissan Motor Company, Limited, Japan

[21] Appl. No.: 286,732

[22] Filed: Dec. 20, 1988

[30] Foreign Application Priority Data

Dec. 21, 1987 [JP] Japan .................. 62-321473

[51] Int. Cl.$^5$ .................. H03M 1/78; H03M 1/68
[52] U.S. Cl. .................. 341/154; 341/145
[58] Field of Search ........... 341/145, 154, 144, 156, 341/159

[56] References Cited

U.S. PATENT DOCUMENTS

| | | | |
|---|---|---|---|
| 4,430,642 | 2/1984 | Weigand et al. | 341/120 X |
| 4,533,903 | 8/1985 | Yamada et al. | 341/159 X |
| 4,612,531 | 9/1986 | Dingwall et al. | 341/156 |
| 4,616,212 | 10/1986 | Law et al. | 341/145 |
| 4,635,036 | 1/1987 | Yoshizawa | 341/156 |
| 4,638,303 | 1/1987 | Masuda et al. | 341/154 X |

FOREIGN PATENT DOCUMENTS

| | | | |
|---|---|---|---|
| 0079681 | 5/1983 | European Pat. Off. | 341/127 |
| 61-274424 | 12/1986 | Japan . | |
| 62-134 | 1/1987 | Japan . | |

Primary Examiner—William M. Shoop, Jr.
Assistant Examiner—Sharon D. Logan
Attorney, Agent, or Firm—Lowe, Price, LeBlanc, Becker & Shur

[57] ABSTRACT

A circuit and method for converting a digital input into an analog quantity are disclosed in which a resistance ladder having a $2^{n/2}$ number of resistors corresponding to n-bit number of bits of the digital input for equally dividing a predetermined voltage to generate the analog quantities, a first decode/switch circuit for retrieving from the resistance ladder a first analog quantity corresponding to a digital quantity which is larger by 1 than upper digits of the digital input, a second decode/switch circuit for retrieving from the resistance ladder a second analog quantity corresponding to a digital quantity of a two's complement of lower digits of the digital input and a differential amplification circuit, responsive to the first and second analog quantities, for shifting down the second analog quantity by a digit number corresponding to the lower digits, subtracting the shifted down second analog quantity from the first analog quantity, and outputting an analog quantity corresponding to the digital input are provided so that the digital-to-analog converting circuit, the construction of which is described above, can easily be assembled on a semiconductor substrate with the number of parts of the digital-to-analog converting circuit reduced.

12 Claims, 1 Drawing Sheet

CIRCUIT AND METHOD FOR CONVERTING DIGITAL SIGNAL INTO CORRESPONDING ANALOG SIGNAL

BACKGROUND OF THE INVENTION (1) Field of the Invention

The present invention relates to a circuit of a digital-to-analog converter and method for converting a digital signal into a corresponding analog signal suitable for assemblies of monolithic ICs.

(2) Description of the Background Art

A Japanese Patent Application First Publication (Unexamined) Sho 61-274424 (referred, hereinafter, to as reference 1) published on Dec. 4, 1986 exemplifies one of previously proposed structures of digital-to-analog converters (hereinafter referred simply to as D/A converters) of a resistance voltage divided type.

In the voltage divided type of D/A converters disclosed in the reference 1, a resistance ladder in which a $2^n$ number of resistors R having equal resistance values are serially connected to an input terminal for receiving an n-bit digital input signal.

The resistance ladder causes a reference voltage $V_R$ applied across the resistance ladder to be equally divided into $2^n$ to set each voltage for generating an analog quantity at each junction of the plurality of series connected resistors R. Each junction of the resistors R in the resistance ladder is also connected to one end of an analog switch, the total number of the analog switches being ($2^n-1$). The other end of each analog switch is commonly connected to an output terminal of the analog quantity via a buffer. In addition, a decoder is provided in the D/A converter for receiving a digital input signal and providing a control signal for turning on or off each analog switch.

When the digital signal having a plurality of bits is inputted into the decoder and decoded by the decoder, one of the analog switches is turned on in response to the control signal derived from the decoder so that the analog quantity (voltage) corresponding to the digital input quantity appears on the output terminal of the D/A converter.

Another previously proposed D/A converter will be described below.

The other previously proposed D/A converter of a weighted resistance type (referred, hereinafter, to as reference 2) is provided with an operational amplifier having a grounded non-inverting input terminal and an inverting input terminal connected to parallel connected resistors R, 2R, 4R, 8R, 16R equal in number to the number of bits of the digital input signal. The output terminal of the operational amplifier serves as an output terminal of the D/A converter and is connected to the inverting input terminal via a resistor $R_f(=R/2)$.

The parallel-connected resistors and associated operational amplifier in the reference 2 constitute an addition circuit. Each resistor has a resistance value weighted as a binary weight such as R, 2R, 4R, 8R, 16R and 32R. Hence, if a resistance value of a resistor corresponding to 1 bit (Least Sgnificant Bit) is, for example, 1 K ohms (K$\Omega$), the resistance value corresponding to n bit (Most Significant Bit) is set to $2^{n-1}$ K ohms (K$\Omega$).

In addition, one contact of an analog switch is connected to each resistor, one of the other contacts thereof is connected to a reference volatge supply, and the remaining contact thereof is connected to the ground.

In the reference 2, when the digital input signal is inputted into the decoder and the decoder outputs the control signal, each switch is operated to connect the reference voltage supply to the corresponding resistor or connect the ground to the corresponding resistor in response to the control signal. Therefore, each switch which receives 1 bit code is operated to connect the reference voltage supply to the corresponding resistor so that the analog quantity corresponding to the sum of the resistors which receive the reference voltage supply appears on the output terminal.

In a still another previously proposed D/A converter of a current addition type (referred, hereinafter, to as reference 3), the resistor ladder is constituted by the plurality of resistors. Resistors having values of Rs are cascade connected from the reference voltage supply to the ground. One end of the cascade-connected (string) resistors R is grounded The other end of the cascade-connected resistors R is connected to the reference voltage supply. Each one end of the resistors Rs except the rightmost resistor R is connected with each one end of a plurality of other resistors having the values of 2R. Each other end of the other resistors 2Rs is connected with a corresponding analog switch. One contact of each analog switch is grounded and the other contact therefo is connected to the inverting input terminal of the operational amplifier. The non-inverting input terminal of the operational amplifier is grounded. The feedback resistor having the value of R is connected between the inverting input terminal and output terminal of the operational amplifier. A plurality of these resistors having the values of 2Rs are connected to respective junctions between the cascade connected resistors R. One of the other contacts of the respective switches is connected to the reference voltage supply and the remaining contact of the respective switches is connected to the ground. Each analog switch receives the control signal from the decoder and is turned to connect the reference voltage supply to the corresponding resistor having the value of 2R when the corresponding bit of the digital input signal indicates 1.

Accordingly, a current flow through the corresponding resistor of 2R.

At this time, binary weights such as $I_o/2$, $I_o/4$, $I_o/8$ and so on are provided through the resistors having the values of 2Rs in an order from the position corresponding to the least significant bit of the digital input signal to the position corresponding to the most significant position. In addition, the analog switches corresponding to the respective bits indicated by 1 of the digital input are turned on so that the current flowing through the resistors having the values of 2R are added to the operational amplifier and the analog quantity corresponding to the digital input is outputted.

A further another previously proposed A/D converter of a voltage divided type (referred to as reference 4) will be described below.

The further previously proposed A/D converter (reference 4) is provided with a resistor ladder having the plurality of resistors. Resistors having the values of Rs are cascade connected. One end of the cascade-connected resistors Rs is grounded via a resistor having the value of 2R. The other end of the cascade-connected resistors Rs is connected to the non-inverting input terminal of the operational amplifier (buffer) and to the ground via a resistor having the value of 2R. Each junction of the cascade-connected resistors Rs is connected to one end of another resistor having the value of 2R. Each analog switch having one contact connected to the reference voltage supply and the other contact connected to the ground is connected to a corresponding resistor having the value of 2R.

When one of the analog switches corresponding to [1] of each bit in the digital input is switched to the reference voltage supply so that the voltage appearing on the corresponding junction is added at the noninverting input terminal of the buffer of the other voltage at the other junction which corresponds to the other one of the analog switches which is operated according to the bit 1 of the other bits of the digital input. Therefore, only the resistor ladder of R−2R serves to output the analog quantity from the output terminal of the buffer which corresponds to the digital input.

A Japanese Patent Application First Publication (Unexamined) Sho 62-134 published on Jan. 6, 1987 (referred, hereinafter, to as reference 5) exemplifies a still another previously proposed D/A converter of a capacitor divided type.

In the reference 5, the D/A converter includes three capacitors having same capacitance values, seven switches, and one operational amplifier.

A first switch of the switches is turned off for the reference voltage to be charged in a first capacitor of the capacitors. At this time, a second capacitor is discharged by means of a fourth and fifth switches. In addition, a seventh switch causes a third capacitor to be discharged. Next, when the first, fourth, fifth and seventh switches are turned off and the second switch is turned on, an electric charge in the first capacitor is distributed into the second capacitor to provide $V_2$ (a voltage across the second capacitor)=$\frac{1}{2} \times V_R$ (reference voltage). If a MSB (Most Significant Bit) of the digital input indicates [1], the electric charge across the second capacitor is transferred into the third capacitor by means of the third switch. On the other hand, if the MSB indicates [0], the fourth switch causes the electric charge across the second capacitor to be discharged.

Thereafter, when the next significant bit indicates 0 and the second switch is turned on, the electric charge across the first capacitor is distributed to the second capacitor to provide $V_1$ (voltage across the first capacitor)=$\frac{1}{4} \times V_R$. Thereafter, in the same way as described above, the electric charge across the second capacitor is discharged so as to correspond to the digital input or transferred into the third capacitor.

In this way, the voltage at the output terminal of the operational amplifier indicates 11/16 $V_R$ ($\frac{1}{2}$ $V_R$+$\frac{1}{8}$ $V_R$+1/16 $V_R$) when the digital input signal indicates 1011.

The analog quanity corresponding to the digital input is sequantialy outputted from the output terminal by the repetition of the above-described operation until the LSB (Least Significant Bit) is reached.

The above-described five references have the following problems respectively.

That is to say, in the reference 1, the number of resistors constituting the resistor ladder must equal $2^n$, n beingb the number of bits of the digital input. For example, if the digital input is constituted by 8 bits, 256 number of the resistors are required. As the number of bits increases, the area they occupy on a semiconductor substrate becomes increased. For example, in the case of the 8-bit digital input, about 3 mm per 5 μm rule must be required. Therefore, it becomes difficult to carry out an assembly of monolithic IC device.

In addition, in the reference 2, binary weight is provided for each resistor. If the resistor corresponds to one bit, the resistors corresponding to n bit indicate $2^{n-1}$ kΩ. For example, in the case of 8 bits, one of the resistors which corresponds to 8th bit (MSB) require 128 kΩ. Therefore, it becomes difficult to assemble each resistor having such a resistance value on the same semiconductor substrate.

Furthermore, if the analog switch connected to each corresponding resistor is formed of, e.g., MOSFETs and on resistance of the MOSFETs is reduced to a negligible degree with respect to each resistor for which the corresponding resistance value is provided, an extremely large area is required for a single chip. It is very difficult to assemble the MOSFETs having such large areas as described above and having the equal number to the number of bits in the digital input on the same semiconductor substrate.

The switches in the references 3 and 4 have the same problems as those switches in the reference 1.

It is necessary, in the case of the reference 5, to provide a large, capacitance, i.e., a large area for each capacitor to provide a high accuracy of the D/A converter output. This contributes the difficulty in assemblies of the capacitors in the same semiconductor substrate. In addition, since the analog quantity is determined from a floating node of each of the first and third capacitors, a noise-free operation of the D/A converter in the semiconductor substrate cannot be ahieved.

SUMMARY OF THE INVENTION

It is an object of the present invention to provide a circuit and method for converting a digital signal into an analog signal which are most suitable for manufacturing monolithic ICs (Intergrated Circuits).

It is another object to provide the digital-to-analog (D/A) converter and its method having the less resistors so that an occupying area of the resistors on a semiconductor substrate can remarkably be reduced.

The above-described objects can be achieved by providing a circuit for converting a digital input into an analog quantity, comprising: (a) a resistance ladder having a $2^{n/2}$ number of resistors corresponding to an n-bit digital input quantity, the resistance ladder equally dividing a predetermined voltage to provide analog quantities at respective junctions of the resistors (b) first circuitry for selecting from the analog quantities provided in the resistance ladder a first analog quantity corresponding to a digital quantity which is larger by 1 than upper digits of the digital input; (c) second circuitry for selecting from the resistance ladder a second analog quantity corresponding to a digital quantity of a two's complement of other lower digits of the digital input; and (d) third circuitry, responsive to the first and second analog quantities, for shifting down the second analog quantity by a digit number corresponding to the lower digits, subtracting the shifted down second analog quantity from the first analog quantity, and outputting the analog quantity of the subtracted result.

The above-described objects can also be achieved by providing a circuit for converting a digital input into an analog quantity, comprising: (a) a resistance ladder having a plurality of resistors for equally dividing a predetermined voltage to provide the equally divided analog voltages at respective junctions of the resistors; (b) a first decode/switch circuit for retrieving from the resistance ladder a first analog quantity corresponding to a digital quantity which is larger by 1 than upper half digits of the digital input; (c) a second decode/switch circuit for retrieving from the resistance ladder a second analog quantity corresponding to a digital quantity of a two's complement of lower half digits of the digital input; and (d) a differential amplification circuit, responsive to the first and second analog quantities, for shifting down the second analog quantity by a digit number corresponding to the lower half digits, subtracting the shifted down second analog quantity from the first analog quantity, and outputting an analog quantity corresponding to the digital input at its output terminal.

The above-described object can also be achieved by providing: a method for converting a digital input into an analog quantity, comprising the steps of: (a) providing a resistance ladder having a $2^{n/2}$ number of series-connected resistors for equally dividing a predetermined voltage to generate the analog quantities at its output terminals on a semiconductor substrate; (b) selecting a first analog voltage corresponding to a digital quantity which is larger by 1 than upper digits of the digital input from the generated voltages by the resistance ladder; (c) selecting a second analog voltage corresponding to a digital quantity of a two's complement of lower digits of the digital input from the generated voltages by the resistance ladder; (d) shifting down the second analog voltage by a digit number corresponding to the lower digits of the digital input; and (e) subtracting the shifted down second analog quantity from the first analog voltage and outputting an analog voltage corresponding to the digital input.

DETAILED DESCRIPTION OF THE PREFERRED EMBODIMENT

Reference will hereinafter be made to the drawings in oder to facilitate understanding of the present invention.

Figure 1:
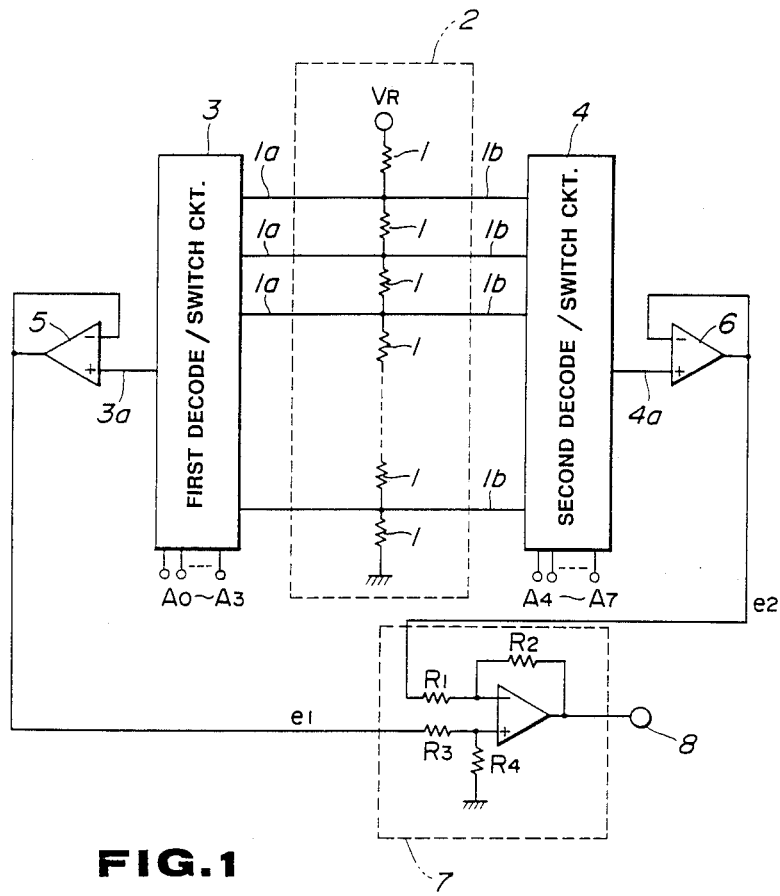
FIG. 1 is an electric circuit block diagram of a digital-to-analog converter in a preferred embodiment according to the present invention.

FIG. 1 shows a circuit block diagram of a digital-to-analog (D/A) converter according to the present invention.

A resistance ladder 2 is constituted by series connected resistors 1 having equal resistance values. The number of resistors 1 is $2^{n/2}$, wherein n denotes the number of bits of the digital input.

For example, if the digital input is eight bits $A_0$ to $A_7$ as shown in FIG. 1, 256 resistors ($2^8$) are required in the case of the reference 1 but in the preferred embodiment only $2^4(=16)$ resistors are required to constitute the resistors 1.

The resistance ladder 2 causes a reference voltage $V_R$ to be equally divided into 16 (in the case of 8-bit digital input) so that each voltage for generating an analog quantity is set at a connection point of each of the resistors 1.

First decode/switch circuit 3 and second decode/switch circuit 4 are disposed with the resistance ladder 2 as a center and the connection point of each resistor 1 is connected to both first and second decode switch circuits 3 and 4 via output lines 1a and 1b.

Figure 2:
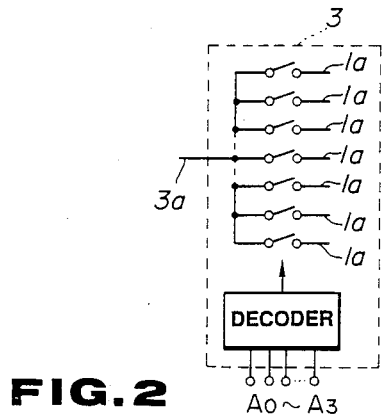
FIG. 2 is an electric circuit block diagram of a first decode switch circuit shown in FIG. 1.

FIG. 2 shows the construction of the first decode switch circuit 3.

As shown in FIG. 2, the first decode/switch circuit 3 includes a decoder and a plurality of analog switches which are turned on or off according to a decoded output signal of the decoder. The construction of the second decode/switch circuit 4 is substantially the same as the first decode/switch circuit 3.

It is noted that since each voltage for generating the analog quantity is generally determined according to the divisions of the respective resistors in the resistance ladder 2, an ON resistance of each analog switch in the first and second decode/switch circuits 3 and 4 does not need to be particularly small to a negligible degree with respect to each resistor 1. Hence, the analog switches in the first and second decode/switch circuit 3 and 4 can be formed CMOS of MOSFETs (Metal Oxide Semiconductor Field Effect Transistors) having relatively but not extremely small areas.

The first decode/switch circuit 3 receives upper digits $A_0$ to $A_3$ of the digital input $A_0$ to $A_7$, picks up a first analog quantity corresponding to a digital quantity of (1011) which is larger by 1 than (1010) if the upper digits ($A_0$ to $A_3$) indicate, e.g., (1010), and outputs the first analog quantity to the output terminal 3a.

On the other hand, the second decode/switch circuit 4 receives lower digits of the digital input except the upper digits $A_0$ to $A_3$, i.e., $A_4$ to $A_7$. Then, if a digital quantity (negative digital quantity) of two's complements of the lower digits $A_4$ to $A_7$ indicates, for example, 0110, a second analog quantity corresponding to its two's complements, i.e., 1010 is picked up from the resistance ladder 2 and is outputted via the output terminal 4a.

The output terminal 3a of the first decode/switch circuit 3 is connected to a resistor $R_3$ connected to a non-inverting input terminal of a differential amplifier 7 via a buffer (impedance vonverter) 5. In addition, the output terminal 4a of the second decode/switch circuit 4 is connected to a resistor $R_1$ at a non-inverting input terminal of the differential amplifier 7 via a buffer 6.

The differential amplifier 7 includes resistors $R_1$ to $R_4$ connected as shown in FIG. 1 in which $R_2/R_1/R_4/R_3$.

$$K_1 = R_2/R_1, \quad K_2 = R_4/R_3 \tag{1}$$

Specifically, in a case where the digital input indicates 8 bits, $K_1 = 1/16$, $K_2 = 16$.

The differential amplifier 7 is constituted in an asymmetrical form. When the first analog quantity $e_1$ derived from the first/decode switch circuit 3 and second analog quantity $e_2$ derived from the second decode/switch circuit $e_3$ are inputted to the differential amplifier, the differential amplifier 7 carries out a subtraction operation in such a way that the second analog quantity $e_2$ is subtracted from the first analog quantity $e_1$ with a bit lower shift (lower carry) by the number of bits of the lower digits $A_4$ to $A_7$ of the digital input to meet the analog quantity corresponding to the upper digits of the digital input $A_0$ to $A_3$. It is noted that the bit lower shift corresponds to a division of the second analog quantity by the number of bits in the lower digits $A_4$ to $A_7$.

An operation of the D/A converter shown in FIGS. 1 and 2 will be described below.

It is noted that the operation will be described in the case of the 8-bit D/A converter.

The upper four bits ($A_0$ to $A_3$) from among the 8-bit digital input ($A_0$ to $A_7$) are inputted into the first decode/switch circuit 3 and lower four bits ($A_4$ to $A_7$) are inputted into the second decode/switch circuit 4.

If the contents of the 8-bit digital input are, e.g., 10100110, one of the analog switches corresponding to the digital quantity 1011 which is 1 larger than the upper digits ($A_0$ to $A_3 = 1010$) in the first decode/switch circuit 3 is turned on so that the first analog quantity $e_1$, i.e., the voltage across the resistors in the resistance ladder 2 corresponding to the digital quantity of 10100000 is outputted from the output terminal 3a.

On the other hand, in the second decode/switch circuit 4, one of the analog switches corresponding to the digital quantity of the two's complement 1010 of the lower digits ($A_4$ to $A_7 = 0110$) is turned on so that a second analog quantity $e_2$, i.e., the voltage across the resistors 1 corresponding to the digital quantity 01100000 is outputted from the output terminal 4a.

The first analog quantity $e_1$ (voltage corresponding to 10100000) is inputted at the non-inverting input terminal in the differential amplifier 7 via the buffer 5. The second analog quantity $e_2$ (voltage corresponding to 01100000) is inputted at the inverting input terminal in the differential amplifier 7 via the buffer 6. The differential amplifier 7 includes the feedback and input resistors $R_1$ to $R_4$ set in the above-expressed equation (1). The following arithmetic operation is carried out for the first and second analog quantities $e_1$ and $e_2$ so that the analog quantity $e_0$ corresponding to the digital input $A_0$ to $A_7$ is outputted via the output terminal 8.

$$e_0 = [(K_2/(1+K_2)] \times (1+K_1)e_1 - K_1 e_2 \quad (2)$$

If K equals $K_1$ and $K_2$, $e_0 = K(e_1 - e_2)$.

Since, in this case, the digital input is 8 bits as described above, $K_1 = 1/16$ and $K_2 = 16$.

The equation (2) can, then, be expressed as follows.

$$e_0 = e_1 - (e_2/16) \quad (3)$$

In this way, the second analog quantity $e_2$ is divided by 1/16 to return the digits to the original position since the lower bits are upper shifted by 4 digits in the resistance ladder 2 and subtracted from the first analog quantity $e_1$. (The four bits of the lower digits ($A_4$ to $A_7$) are lower carried by four bits of the same digit number and subtracted from the first analog quantity $e_1$.)

In the above-described preferred embodiment, the arithmetic operation corresponding to the following calculation is carried out in the differential amplifier 7.

```
  10110000 - e₁
-)    1010 - e₂
  10100110 - e₀
```

The analog quantity $e_0$ corresponding to the digital input (10100110) is consequently outputted from the output terminal 8.

In the preferred embodiment, the resistance ladder for a four-bit digital input in the case of the reference 1 can be used as that for the 8-bit digital input.

It is noted that if $K_1 = a/16$, $K_2 = a/[1-a+(a/16)]$, the analog quantity $e_0$ is multiplied by a and converted into the analog quantity.

In addition, if $K_1 = 1/K_2$, an arbitary pair of resistance ladders may convert the digital input into the analog quantity. The number of output lines 1a and 1b may be different from each other in the resistance ladder 2. In this case, the number of resistors 1 may be provided depending on the larger number of output lines.

As described hereinabove, since in the D/A converter according to the present invention the first decode/switch circuit corresponding to upper digits of the digital input and second decode/switch circuit corresponding to lower digits of the digital input are disposed, the first decode/switch circuit inputs the first analog quantity corresponding to the digital quantity larger by 1 than the upper digits from the resistance ladder, while the second decode/switch circuit inputs the second analog quantity corresponding to the digital quantity of the two's complement of the lower digits from the same resistance ladder, and the differential amplifier carries out required arithmetic operations for the first and second analog quantities to produce the analog quantity corresponding to the digital input, the number of resistors in the resistance ladder for generating the analog quantity can remarkably be reduced and the number of the analog switches incorporated in the first and second decode switches can accordingly be reduced.

Consequently, the total area of the resisrors and analog switches occupied on the semiconductor substrate can remarkably be reduced and the D/A converters extremely suitable for the monolithic ICs can be provided.

It will fully be appreciated by those skilled in the art that the foregoing description is made in terms of the preferred embodiment and various changes and modifications may be made without departing from the scope of the presently invention.

What is claimed is:

1. A circuit for converting a digital input into an analog quantity, comprising:
    (a) a resistance ladder having a $2^{n/2}$ number of resistors corresponding to an n-bit digital input quantity, the resistance ladder equally dividing a predetermined voltage to provide analog quantities at respective junctions of the resistors;
    (b) first circuitry for selecting from the analog quantities provided in the resistance ladder a first analog quantity corresponding to a digital quantity which is larger by 1 than upper digits of the digital input;
    (c) second circuitry for selecting from the resistance ladder a second analog quantity corresponding to a digital quantity of a two's complement of other lower digits of the digital input; and
    (d) third circuitry, responsive to the first and second analog quantities, for shifting down the second analog quantity by a digit number corresponding to the lower digits, subtracting the shifted down second analog quantity from the first analog quantity, and outputting the analog quantity of the subrtacted result.

2. A circuit as set forth in claim 1, wherein the upper digits of the digital input are upper half of the digital input and the lower digits thereof are lower half digits thereof.

3. A circuit as set forth in claim 2, wherein the shift down of the second analog quantity means the division of the second analog quantity by the digit number of the lower digits of the digital input.

4. A circuit as set forth in claim 3, wherein the third circuitry includes a differential amplifier constituting a subtractor having feedback and input resistors $R_1$ to $R_4$, resistance value ratios thereof for the first and second analog quantities being set according to the number of digits of the digital input in the following:

$K_1 = R_2/R_1$, wherein $R_1$ denotes the input resistor for the second analog quantity and $R_2$ denotes the feedback resistor connected between an inverting input terminal of the differential amplifier and output terminal thereof; and $K_2 = R_4/R_3$, wherein $R_4$ denotes the input resistor connected between a non-inverting input terminal of the differential amplifier and the ground and $R_3$ denotes the input resistor for the first analog quantity, wherein the ratios $K_1$ and $K_2$ represent gain ratios of said differential amplifier.

5. A circuit as set forth in claim 4, wherein the first circuitry includes a first decoder and a plurality of first switching elements whose switchings are controlled by the decoder output of the first decoder so that the output of the first circuit indicates the first analog quantity provided at the resistance ladder corresponding to the digital quantity which is larger than the upper half digits of the digital input by 1.

6. A circuit as set forth in claim 5, wherein the second circuitry includes a second decoder and a plurality of second switching elements whose switchings are controlled by the decoder output of the second decoder so that the output of the second circuit indicates the second analog quantity provided at the resistance ladder corresponding to the digital quantity of the two's complement of lower half digits of the digital input.

7. A circuit as set forth in claim 6, wherein the analog quantity $e_0$ derived from the third circuitry is expressed as follows:

$$e_0 = [K_2/(1+K_2)] \times (1+K_1)e_1 - K_1 e_2,$$

wherein $e_1$ denotes the first analog quantity and $e_2$ denotes the second analog quantity.

8. A circuit as set forth in claim 7, wherein the digital input is an eight-bit digital quantity and circuitry is expressed as follows:

$$e_0 = e_1 - (e_2/16).$$

9. A circuit as set forth in claim 8, wherein $K_1 = a/16$ and $k_2 = a/[1-a+(a/16)]$, wherein a denotes an arbitrary number.

10. A circuit for converting a digital input into an analog quantity, comprising:
(a) a resistance ladder having a plurality of resistors for equally dividing a predetermined voltage to provide the equally divided analog voltages at respective junctions of the resistors;
(b) a first decode/switch circuit for retrieving from the resistance ladder a first analog quantity corresponding to a digital quantity which is larger by 1 than upper half digits of the digital input;
(c) a second decode/switch circuit for retrieving from the resistance ladder a second analog quantity corresponding to a digital quantity of a two's complement of lower half digits of the digital input; and
(d) a differential amplification circuit responsive to the first and second analog quantities, for shifting down the second analog quantity by a digit number corresponding to the lower half digits, subtracting the shifted down second analog quantity from the first analog quantity, and outputting an analog quantity corresponding to the digital input at its output terminal.

11. A method for converting a digital input into an analog quantity, comprising the steps of:
(a) providing a resiatance ladder having a $2^{n/2}$ number of series-connected resistors for equally dividing a predetermined voltage to generate the analog quantities at its output terminals on a semiconductor substrate;
(b) selecting a first analog voltage corresponding to a digital quantity which is larger by 1 than upper digits of the digital input from the generated voltages by the resistance ladder;
(c) selecting a second analog voltage corresponding to a digital quantity of a two's complement of lower digits of the digital input from the generated voltages by the resistance ladder;
(d) shifting down the second analog voltage by a digit number corresponding to the lower digits of the digital input; and
(e) subtracting the shifted down second analog quantity from the first analog voltage and outputting an analog voltage corresponding to the digital input.

12. A circuit as set forth in claim 4, wherein said resistors have resistance values such that $K_1 \neq K_2$.

* * * * *